(12) United States Patent
Hedayat et al.

(10) Patent No.: US 8,190,980 B2
(45) Date of Patent: *May 29, 2012

(54) TRELLIS-BASED DECODER USING STATES OF REDUCED UNCERTAINTY

(75) Inventors: Ahmadreza Hedayat, Allen, TX (US); Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 668 days.

This patent is subject to a terminal disclaimer.

(21) Appl. No.: 12/362,522

(22) Filed: Jan. 30, 2009

(65) Prior Publication Data
US 2009/0135938 A1    May 28, 2009

Related U.S. Application Data

(63) Continuation of application No. 11/691,013, filed on Mar. 26, 2007, now Pat. No. 7,512,870.

(60) Provisional application No. 60/841,446, filed on Aug. 30, 2006.

(51) Int. Cl.
*H03M 13/00* (2006.01)
(52) U.S. Cl. ........ 714/792; 714/794; 714/795; 714/796; 375/265; 375/262; 375/341
(58) Field of Classification Search ................ 714/752, 714/792–796; 375/265, 262, 341
See application file for complete search history.

(56) References Cited

U.S. PATENT DOCUMENTS

| | | | |
|---|---|---|---|
| 5,432,803 A | 7/1995 | Liu et al. | |
| 5,878,098 A * | 3/1999 | Wang et al. | 375/377 |
| 6,041,390 A * | 3/2000 | Liu et al. | 711/110 |
| 6,141,388 A * | 10/2000 | Servais et al. | 375/262 |
| 6,304,939 B1 * | 10/2001 | Liu et al. | 711/110 |
| 6,418,549 B1 | 7/2002 | Ramchandran et al. | |
| 6,477,208 B1 | 11/2002 | Huff | |
| 7,197,689 B2 | 3/2007 | Hekstra et al. | |
| 7,277,506 B1 * | 10/2007 | Pope et al. | 375/341 |
| 7,490,284 B2 * | 2/2009 | Vityaev | 714/795 |
| 2006/0002689 A1 | 1/2006 | Yang et al. | |
| 2007/0092018 A1 | 4/2007 | Fonseka et al. | |

OTHER PUBLICATIONS

Supplementary European Search Report in counterpart European Application No. 07759511.4, mailed Apr. 8, 2010.
Oliver M. Collins et al., "Determinate State Convolutional Codes," IEEE Transactions on Communications, IEEE Service Center, Piscataway, NJ, US, vol. 41, No. 12, Dec. 1, 1993, pp. 1785-1794.
Jong Il Park et al., "A Protocol Aided Concatenated Forward Error Control for Wireless ATM," Wireless Communications and Networking Conference, 2002 IEEE, Piscataway, NJ, US, vol. 2, Mar. 17, 2002, pp. 613-617.

* cited by examiner

*Primary Examiner* — Esaw Abraham
(74) *Attorney, Agent, or Firm* — Edell, Shapiro & Finnan, LLC

(57) ABSTRACT

A method and system are provided for improving the performance of a trellis-based decoder. States with reduced uncertainty (SRUs) are defined for one or more predetermined fields in an encoded message. Metrics are set for the SRUs such that candidate paths through a trellis-based decoding process are eliminated for those states that are not SRUs.

15 Claims, 9 Drawing Sheets

TRELLIS-BASED DECODER USING STATES OF REDUCED UNCERTAINTY

CROSS REFERENCE TO RELATED APPLICATIONS

This application is a continuation of U.S. patent application Ser. No. 11/691,013, entitled "Method and System for Improving the Performance of a Trellis-Based Decoder" and filed Mar. 26, 2007, now issued as U.S. Pat. No. 7,512,870, which in turn is a non-provisional patent application of U.S. Provisional Patent Application No. 60/841,446, filed on Aug. 30, 2006. The entirety of each of the aforementioned patent applications is hereby incorporated herein by reference.

BACKGROUND

Trellis codes, such as convolutional codes, trellis coded modulation, bit-interleaved coded modulations, and space-time trellis codes have been widely used to improve the performance of a wireless communications system. One important issue of encoding messages using trellis codes is how to terminate a trellis. There are at least two common methods of terminating a trellis.

The first method is to force the encoder of a transmitting wireless station to enter a known starting state and then to a known terminating state, e.g. a zero state, after the last data bit is shifted in. This is commonly referred to as a zero-padding (ZP) method. This method brings the trellis into a known terminating state by feeding the encoder with a series of zeros after all data bits are shifted into the encoder. The number of zeros is equal to the size of the memory. Feeding the encoder with a series of zeros resets the state back to zero.

The trellis code decoder of a receiving wireless station decodes a receiving message using the information about the starting and terminating states of the trellis. Knowing the starting and terminating states of a trellis simplifies the design of the decoder of a receiving wireless station. However, the padding of zeros at the end of trellis codes results in additional overhead. This problem is especially significant when the message is of small size.

Another method to terminate a trellis is called tail-biting (TB). In TB, the encoder of a transmitting wireless station is forced to terminate the encoding of a message at a state that is the same as the starting state. Since the TB method does not pad a trellis-encoded message with extra zeros, it does not result in extra overhead. Because the TB method starts and terminates a trellis in the same state, which is unknown to the decoder, decoding the tail-biting trellis with a trellis-based decoder is computationally expensive.

A trellis-based decoder employing the Viterbi algorithm (VA) is a maximum likelihood (ML) decoder if the starting and terminating states of the message encoded with trellis codes are known.

Because the starting and terminating states in a tail-biting method are the same, the ML decoder runs the Viterbi algorithm in each state and selects the code sequence representing the message with the highest probability. The brute force decoding method runs the Viterbi algorithm as many times as the number of states is; therefore, it demands a lot of computational resources. To reduce the computational complexity of the ML decoder for tail-biting trellis codes, several suboptimal trellis-based decoders have been developed.

As such, what is desired is a method and system for further improving the performance of sub-optimal trellis-based tail-biting decoders

DETAILED DESCRIPTION

A method and apparatus are described herein for improving the performance of suboptimal trellis-based decoders employing the Viterbi algorithm by incorporating the information about the structure of the messages in the decoding process. These techniques are applicable to all types of trellis-based decoders for tail-biting trellis code.

The methods disclosed herein take advantage of the knowledge about a predetermined field in a message. The information is used either to improve the performance of a decoder or to reduce the complexity of the decoder. The decoder is programmable, i.e., the decoder can decode messages with different types of predetermined fields of various lengths and at various locations.

The method described herein exploits the information about the structure of a message to improve the performance of a trellis-based decoder. One such structure is the control message of communication standards, such as IEEE 802.16 (WiMAX™), which usually includes predetermined fields of known sizes. The bits in a predetermined field are usually set to a predetermined value (e.g. zero).

Figure 1A:
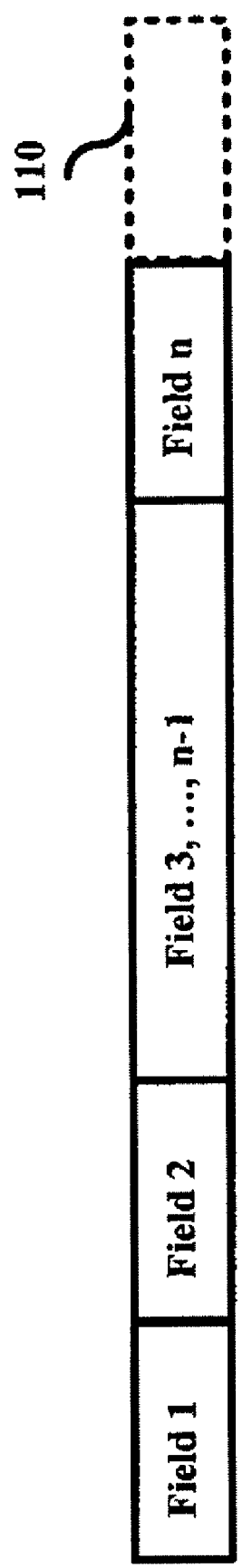
FIGS. 1A, 1B, and 1C illustrate a message with one predetermined field.
Figure 1B:
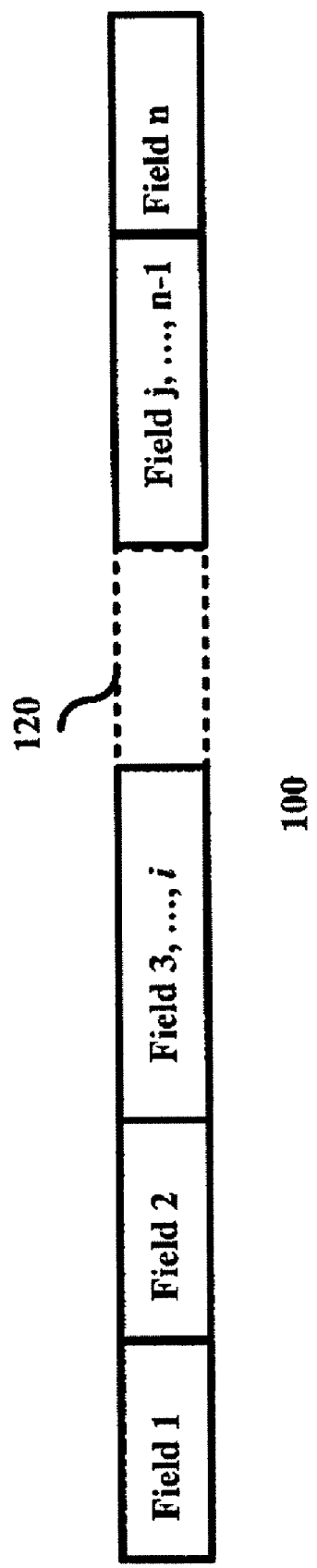
Figure 1C:
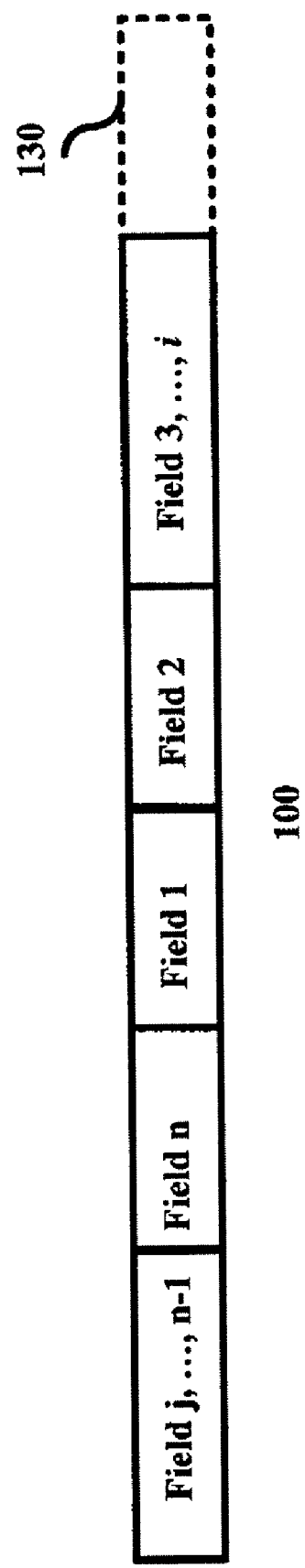

FIGS. 1A, 1B, and 1C illustrate a message with just one predetermined field. In FIG. 1A, a predetermined field 110 is located at the end of a message while in FIG. 1B a predetermined field 120 is in the middle of a message. At first glance, the messages in FIG. 1A and FIG. 1B seem to have different structures. However, if the fields in the message in FIG. 1B are rotated till the predetermined field 130 is at the end of the message, as shown in FIG. 1C, a person having skills in the art would recognize that the two messages have the same structure.

Figure 2:
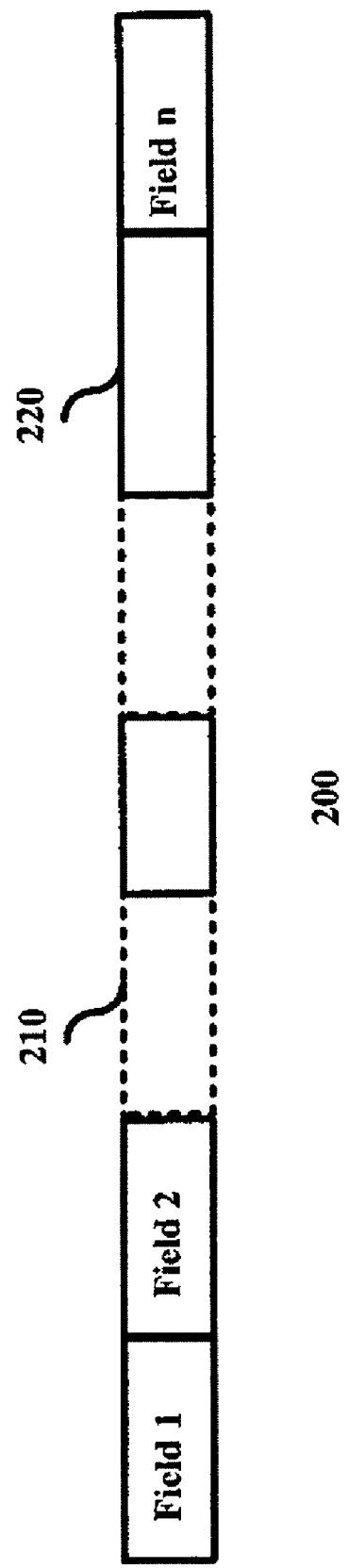
FIG. 2 illustrates a message with multiple predetermined fields.
Figure 3:
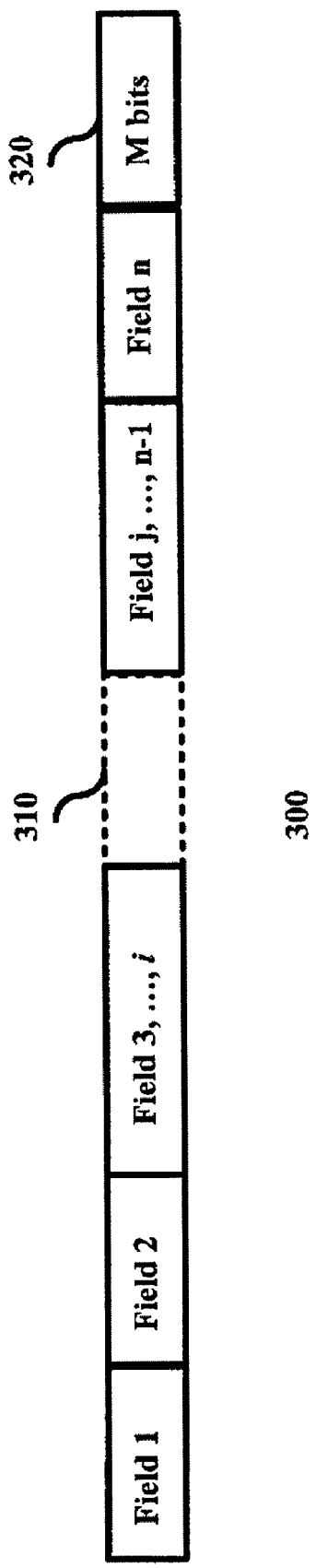
FIG. 3 illustrates a message with a predetermined field and appended with additional bits of a predetermined value at the end of the message.

A control message may have multiple predetermined fields at several locations in a message. FIG. 2 illustrates a message with multiple predetermined fields 210 and 220. FIG. 3 illustrates a message having a predetermined field 310 and appended additional bits 320 of a predetermined value at the end of the message.

In a WiMAX wireless communications system, the FCH is convolutionally encoded using tail-biting termination. The encoder has six memory cells, which means that there are 64 possible states. In other words, the starting or terminating state has a probability of 1/64 being in any of the 64 states.

By knowing that there is a 4-bit predetermined field in the FCH, the disclosed method reduces the number of possible states of a trellis-based decoder. Assuming that the reserved bits in the predetermined field are all set to zero, the number of states is reduced to 4. By setting the four reserved bits to zero, the numbers representing the starting and terminating states are multiples of 16. In other words, the starting and terminating states are one or two of the following states—{0, 16, 32, 48}.

The term "the state with reduced uncertainty" (SRU) refers to a set of states that are associated with a predetermined field. The maximum likelihood path passes through one of these states by the end of the predetermined field.

Each SRU is associated with a time instance determined by the location of the predetermined state. The values of the states in an SRU are determined by the values of the bits in predetermined fields. Effectively, the information about each predetermined field reduces the number of states that the maximum likelihood path might pass through at the end of the predetermined field. As a result the probability that the maximum likelihood path passes through one of the states in the SRU increases and thus the uncertainty is reduced.

The actual value of a predetermined bit is inconsequential as long as it is known a prior by the decoder. The non-zero predetermined bits change the SRU, but its size remains intact. The performance improvement or complexity reduction only depends on the size of the SRU. A decoder can use the SRU in various ways. For example, a trellis-based decoder for tail-biting (TB) trellis codes performs the VA algorithm only in the states of the SRU rather than all possible states. In the example described above, the VA algorithm only needs to repeat four times rather than 64 times.

The level of reduction in the complexity of a decoder depends on the number of bits in a predetermined field in a message and the number of memory cells (equivalent to the number of states) of the trellis code. As a result, the trellis-based decoder for TB trellis codes does not guarantee that it always reduces the complexity to the same degree. However, it is possible to take advantage of the SRU in sub-optimal trellis-based decoders for TB trellis codes.

A trellis-based decoder for convolutional codes is modeled and evaluated based on the level of its complexity and performance. The information about the SRU can be used to either reduce the complexity or improve the performance of a decoder. It is feasible to devise a decoder with a tradeoff between the performance and complexity.

A sub-optimal trellis-based decoder for TB trellis codes improves its performance by using the SRU to reduce the uncertainty in the initialization process. Depending on the number of states of trellis codes and the length of a message, most sub-optimal trellis-based decoders for TB trellis codes perform the VA algorithm more than once over the whole length of the message or part of the message in order to achieve a level of performance close to that of an optimal trellis-based decoder for TB trellis codes. For a short message that has a trellis code with a large number of states, the VA algorithm may be performed over the whole message twice or three times.

After a trellis-based decoder initializes the states based on the information about the SRU, its complexity is reduced. The decoder achieves similar performance as an optimal trellis-based decoder for TB trellis codes does, but it performs the VA algorithm with fewer iterations.

For the SRU of small size, the trellis-based decoder could run the VA algorithm once and then traces back (i.e. terminates the decoder) from the state that has the best metric at the end of the trellis. In this case, the complexity of the decoder is reduced by some degree and the level of performance is also improved to some degree.

Figure 4:
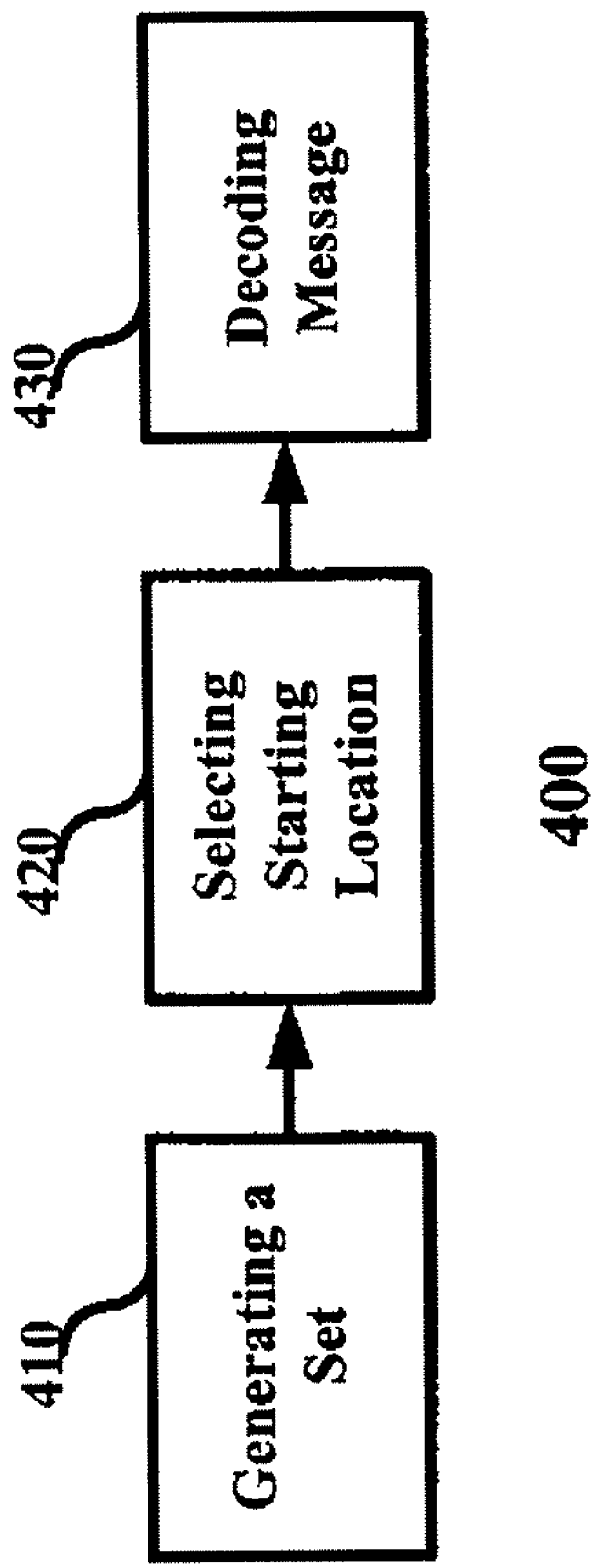
FIG. 4 is a flow diagram that depicts a way to improve the performance of a Viterbi decoder by using the information about one predetermined field of a message.

FIG. 4 is a flow diagram that depicts a way to improve the performance of a trellis-based decoder by using the information about one predetermined field of a message in accordance with the method described herein.

The message structure is described in FIG. 1A and FIG. 1B. In step 410, the metric of a state in a trellis-based decoder is set depending on whether it is in the SRU. The states in the SRU are assigned with the same metric, i.e. zero. This is equivalent to making the probabilities of all the states in the SRU equal. Let the probabilities of the other states be set to the minimum or the largest negative number in logarithmic metric calculations.

In step 420, the location (time instance) of an encoded message sequence is selected. Because the message is terminated using a tail-biting method, the trellis representing the message is circular. In other words, the decoding algorithm such as the VA continues onto the beginning of the message after the end of the message is approached. Because of this property, the decoding process can start at any location in the encoded message sequence. This explains why FIG. 1A and FIG. 1B are deemed equivalent from a TB decoding perspective (see FIG. 1C).

In step 430, the decoding process starts from the selected location. The decoding process continues until the message is decoded and the terminating state of the decoder coincides with the starting state. Taking advantage of the SRU, the decoding process can start from the field next to the right of the predetermined filed.

Figure 5:
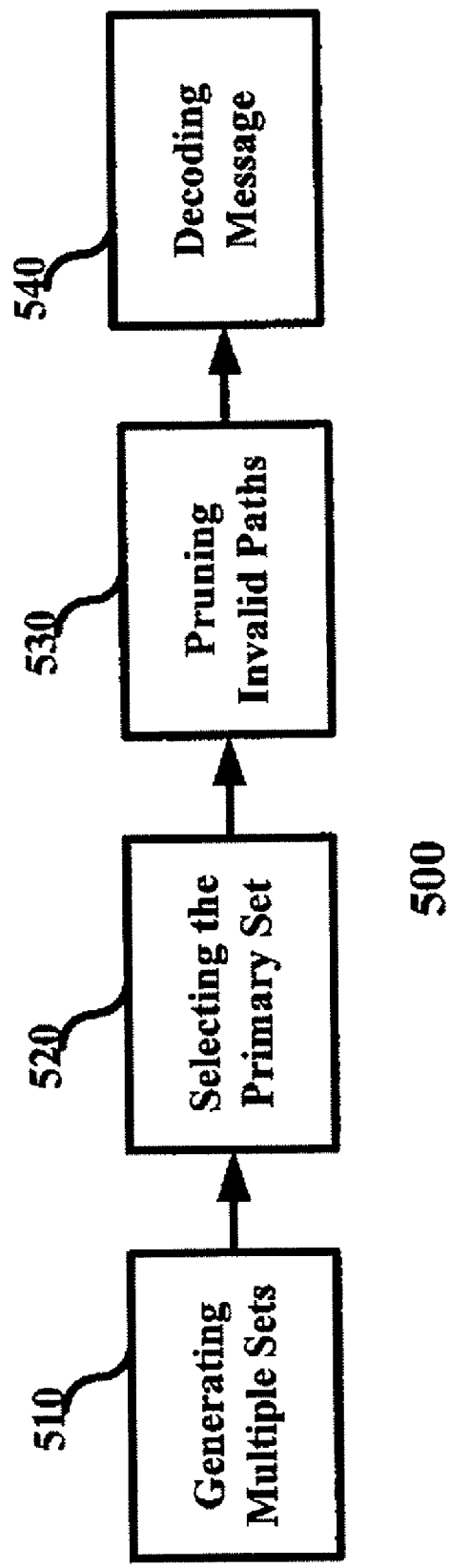
FIG. 5 is a flow diagram that depicts a way to improve the performance of a Viterbi decoder by using the information about multiple predetermined fields of a message.

FIG. 5 is a flow diagram that depicts a way to improve the performance of a trellis-based decoder by using the information about multiple predetermined fields of a message in accordance with the method described herein. The message structure is described in FIG. 2.

In step 510, multiple SRUs are generated. Each of the SRUs corresponds to one predetermined filed. In step 520, one of the SRUs is selected as the primary SRU. Because the location and the size of each of the multiple predetermined fields are known to the trellis-based decoder, the trellis-based decoder can use this additional information to further improve the performance of the decoding process. One way to utilize the information about the structure of the message is to select a SRU with the smallest size.

Assume that there are two predetermined fields with pre-determined bits $K_1$ and $K_2$, and $K_2 > K_1$. Let $SRU_1$ represent a reduced set of states corresponding to the first predetermined field. Let $SRU_2$ represent a reduced set of states corresponding to the second predetermined field. Because $SRU_2$ is the smaller of the two, tail-biting decoding is performed based on $SRU_2$.

The metric of a state in the trellis-based decoder is set depending on whether it is in $SRU_2$. Each of the states in $SRU_2$ is assigned the same metric, i.e., zero. This is equivalent to making the probabilities of all the states in $SRU_2$ equal. Let the probabilities of the other states be set to the minimum or the largest negative number in logarithmic metric calculations.

Step 530 shows that at a predetermined time instance, the trellis-based decoder sets the metrics of the states that do not belong to $SRU_1$ in such a way that the probabilities of these states are the minimum. This is equivalent to setting such states to the smallest number, or the largest negative number in logarithmic metric calculations. This action effectively prunes the trellis to eliminate the invalid candidate paths. This is because the maximum likelihood path must pass through one of the states that belong to $SRU_1$ at the predetermined time instance.

In step 540, the decoding process continues until the message is decoded and the terminating state of the decoder coincides with the starting state.

Figure 6:
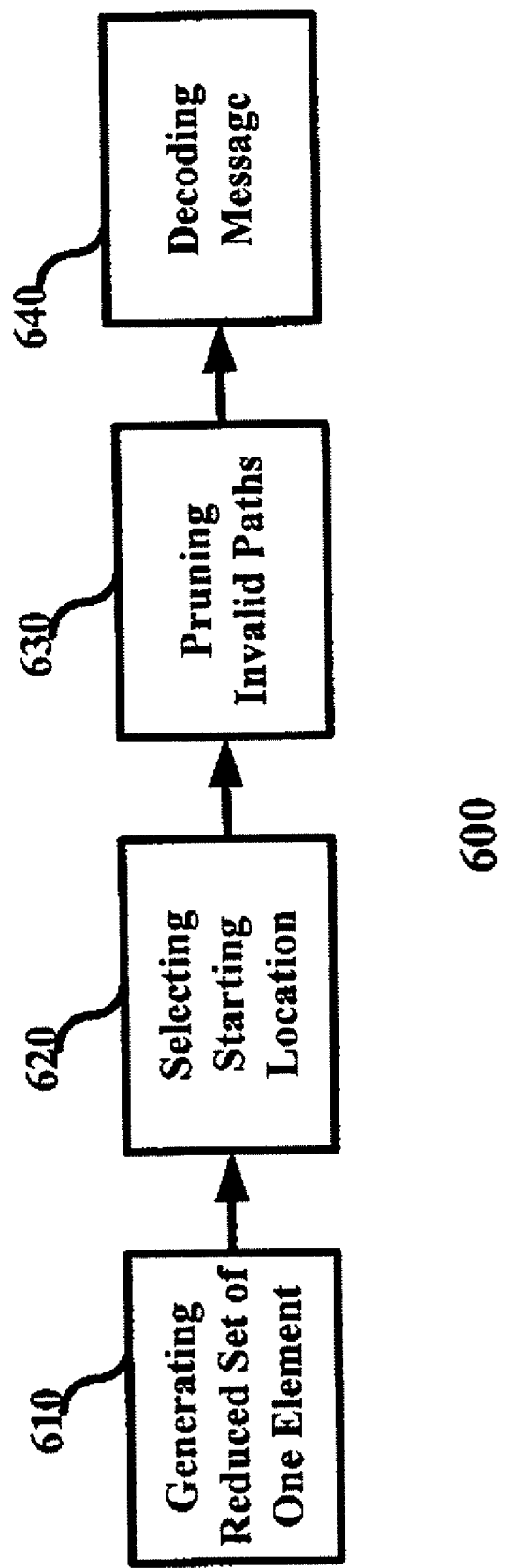
FIG. 6 is a flow diagram that depicts a way to improve the performance of a Viterbi decoder by using the information about one predetermined field of a message which is convolutionally encoded using a zero-padding method.

FIG. 6 is a flow diagram that depicts a way to improve the performance of a trellis-based decoder by using the information about one predetermined field of a message, which is convolutionally encoded using a zero-padding in accordance with the method disclosed in the present. The message is appended with bits of a predetermined value at the end of the message. The message structure is described in FIG. 3.

In step 610, a zero-padding method is applied to the message by inserting M zero bits at the end of the message. The size of the memory cells of the trellis code is M. In essence, the M zero tail bits create an SRU with a size of one, and the only element in the SRU is the all-zero state.

In step 620, the trellis-based decoder employs a conventional VA algorithm to decode the encoded message. In step 630, the trellis-based decoder sets the metric of a state to the smallest number or the largest negative number in logarithmic metric calculations, depending on whether it is in the SRU at a predetermined time instance. This action effectively prunes the trellis to eliminate the invalid paths. As a result the performance of the trellis-based decoder is further improved.

In step 640, the decoding process continues until the message is decoded and the termination state of the trellis-based decoder coincides with the starting state.

Figure 7:
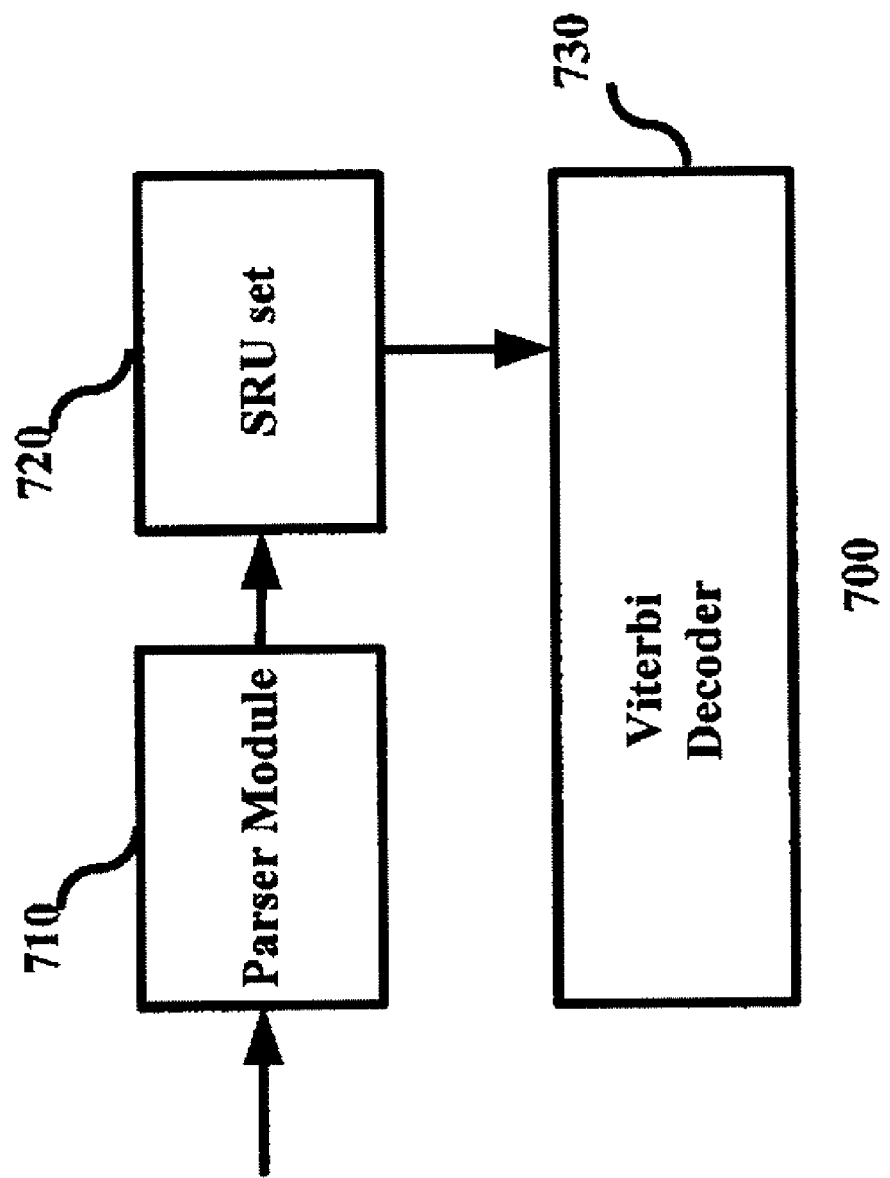
FIG. 7 is a block diagram of a system in accordance with the techniques described herein.

FIG. 7 is a block diagram of a system. The system is composed of a parser module 710, an SRU module 720, and a trellis-based decoder 730.

The parser module 710 identifies one or more predetermined fields in a message with a known value using the knowledge of the structure of the message. The means 720 generates one or more sets of states with reduced uncertainty (SRUs) based on the values of one or more predetermined fields.

The trellis-based decoder 730 initializes the states based on the information about the SRU of the smallest size and sets the metrics of the states in the SRU in such a way that the probabilities of the states are equal. The trellis-based decoder 730 selects a starting state, which could be any state in the encoded message sequence. Because the encoded message is terminated using a tail-biting method, the trellis representing the message is circular. The trellis-based decoder 730 prunes the trellis to eliminate the invalid paths while decoding the message by setting the metrics of the states that are not in the SRU in such a way that the probabilities of the states are the minimum.

Although the methods and apparatus are illustrated and described herein as embodied in one or more specific examples, it is nevertheless not intended to be limited to the details shown, since various modifications and structural changes may be made therein without departing from the spirit of the concepts described herein and within the scope and range of equivalents of the claims. Accordingly, it is appropriate that the appended claims be construed broadly and in a manner consistent with the scope of the following claims.

What is claimed is:

1. An apparatus comprising:
   a parser that is configured to identify at least one predetermined field in a received encoded message sequence that comprises a plurality of fields, the at least one predetermined field comprising values that are known;
   means for generating data representing at least one state with reduced uncertainty for the at least one predetermined field in the encoded message sequence, wherein a state with reduced uncertainty is a state of a trellis-based decoding process that is associated with the at least one predetermined field of the encoded message sequence such that when decoding the encoded message sequence with the trellis-based decoding process a maximum likelihood path of the trellis-based decoding process passes through one or more states of reduced uncertainty by the end of the at least one predetermined field and thereby reduces a number of candidate paths for the encoded message sequence for states that are not states with reduced uncertainty, and wherein the parser is further configured to set a metric associated with a state of the encoded message sequence such that a state with reduced uncertainty is set to a higher probability value than for a state that is not a state with reduced uncertainty; and
   a decoder configured to connect to the means for generating data representing at least one state with reduced uncertainty, wherein the decoder is configured to decode the encoded message sequence with the trellis-based decoding process.

2. The apparatus of claim 1, wherein the means for generating data representing at least one state with reduced uncertainty is configured to generate multiple sets of states with reduced uncertainty, where each set is for a corresponding one of a plurality of predetermined fields in the encoded message sequence whose values are known, and wherein the parser is configured to select one of the multiple sets of states of reduced uncertainty as a primary set, and to set a metric for a state depending on whether or not it is part of the primary set of states with reduced uncertainty such that states that are part of the primary set of states with reduced uncertainty are set to a higher probability value than for a state that is not part of the primary set of states with reduced uncertainty.

3. The apparatus of claim 2, wherein the means for generating data representing at least one state with reduced uncertainty is configured to select as the primary set of states with reduced uncertainty one of the multiple sets of states with reduced uncertainty that is associated with one of the plurality of predetermined fields that has a least number of bits.

4. The apparatus of claim 1, wherein the encoded message sequence is convolutionally encoded and the at least one predetermined field comprises bits of the same value at the end of the encoded message sequence, and wherein the means for generating data representing at least one state with reduced uncertainty is configured to generate a single state of reduced uncertainty corresponding to the at least one predetermined field.

5. An apparatus comprising:
   a parser that is configured to identify at least one predetermined field in a received encoded message sequence that comprises a plurality of fields, the at least one predetermined field comprising values that are known;
   means for generating data representing states with reduced uncertainty for the at least one predetermined field in the encoded message sequence, wherein the states with reduced uncertainty are states of a trellis-based decoding process and are associated with the at least one predetermined field of the encoded message sequence such that when decoding the encoded message sequence with the trellis-based decoding process a maximum likelihood path of the trellis-based decoding process passes through one of the states of reduced uncertainty by the end of the at least one predetermined field and thereby reduces a number of candidate paths for the encoded message sequence for states that are not states with reduced uncertainty; and a decoder configured to connect to the means for generating data representing states with reduced uncertainty, wherein the decoder is configured to decode the encoded message sequence with the trellis-based decoding process.

6. The apparatus of claim 5, wherein the means for generating data representing states with reduced uncertainty is configured to set a metric for a state of the encoded message sequence such that the states of reduced uncertainty are set to a first predetermined value and each of the states of reduced uncertainty has equal probability, and states that are not states with reduced uncertainty are set to a second predetermined value that corresponds to a minimum probability.

7. The apparatus of claim 5, wherein the means for generating data representing states with reduced uncertainty is configured to generate multiple sets of states with reduced uncertainty, where each set is for a corresponding one of a plurality of predetermined fields in the encoded message sequence whose values are known, and wherein the parser is configured to select one of the multiple sets of states of reduced uncertainty as a primary set, and to set a metric for a state depending on whether or not it is part of the primary set of states with reduced uncertainty such that states that are part of the primary set of states with reduced uncertainty are set to the first predetermined value and states that are not part of the primary set of states with reduced uncertainty are set to the second predetermined value.

8. The apparatus of claim 7, wherein the means for generating data representing states with reduced uncertainty is configured to select as the primary set of states with reduced uncertainty one of the multiple sets of states with reduced uncertainty that is associated with one of the plurality of predetermined fields that has a least number of bits.

9. The apparatus of claim 5, wherein the encoded message sequence is convolutionally encoded and the at least one predetermined field comprises bits of the same value at the end of the encoded message sequence, and wherein the means for generating data representing states with reduced uncertainty is configured to generate a single state of reduced uncertainty corresponding to the at least one predetermined field.

10. A method comprising:
    receiving at a destination an encoded message sequence that comprises a plurality of fields including at least one predetermined field whose bit values are known at the destination;
    generating data representing states with reduced uncertainty for the at least one predetermined field in the encoded message sequence, wherein the states with reduced uncertainty are states of a trellis-based decoding process and are associated with the at least one predetermined field of the encoded message sequence such that when decoding the encoded message sequence with the trellis-based decoding process a maximum likelihood path of the trellis-based decoding process passes through one of the states of reduced uncertainty by the end of the at least one predetermined field; and
    decoding the encoded message sequence for a reduced number of candidate paths associated with the trellis-based decoding process by eliminating candidate paths for states that are not states with reduced uncertainty.

11. The method of claim 10, and further comprising setting a metric for a state associated with the encoded message sequence such that the states of reduced uncertainty are set to a first predetermined value and each of the states of reduced uncertainty has equal probability, and states that are not states with reduced uncertainty are set to a second predetermined value that corresponds to a minimum probability.

12. The method of claim 11, wherein the encoded message sequence comprises a plurality of predetermined fields whose bit values are known at the destination, and wherein generating comprises generating multiple sets of states with reduced uncertainty wherein each set is for a corresponding one of the plurality of predetermined fields in the encoded message sequence, and further comprising selecting one of the multiple sets of states of reduced uncertainty as a primary set, and wherein setting comprises setting a metric for a state depending on whether or not it is part of the primary set of states with reduced uncertainty such that states that are part of the primary set of states with reduced uncertainty are set to the first predetermined value and states that are not part of the primary set of states with reduced uncertainty are set to the second predetermined value.

13. The method of claim 12, wherein selecting comprises selecting as the primary set of states with reduced uncertainty one of the multiple sets of states with reduced uncertainty that is associated with one of the plurality of predetermined fields that has a least number of bits.

14. The method of claim 12, and further comprising eliminating candidate paths for states that are not in the primary set of states with reduced uncertainty.

15. The method of claim 10, wherein the encoded message sequence is convolutionally encoded and the at least one predetermined field comprises bits of the same value at the end of the encoded message sequence, and wherein generating comprises generating a single state of reduced uncertainty corresponding to the at least one predetermined field.

\* \* \* \* \*